United States Patent
Athavale et al.

(10) Patent No.: US 6,821,900 B2
(45) Date of Patent: Nov. 23, 2004

(54) METHOD FOR DRY ETCHING DEEP TRENCHES IN A SUBSTRATE

(75) Inventors: Satish Athavale, Fishkill, NY (US); Rajiv Ranade, Brewster, NY (US); Munir Naeem, Poughkeepsie, NY (US); Gangadhara Swami Mathad, Poughkeepsie, NY (US)

(73) Assignees: Infineon Technologies AG, Munich (DE); International Business Machines, Armonk, NY (US)

( * ) Notice: Subject to any disclaimer, the term of this patent is extended or adjusted under 35 U.S.C. 154(b) by 0 days.

(21) Appl. No.: 09/757,123

(22) Filed: Jan. 9, 2001

(65) Prior Publication Data

US 2002/0094690 A1 Jul. 18, 2002

(51) Int. Cl.[7] ............................................ H01L 21/311
(52) U.S. Cl. ...................... 438/700; 438/710; 438/713; 438/714; 438/719
(58) Field of Search ................................. 438/706, 710, 438/714, 715, 723, 724, 700, 713, 719

(56) References Cited

U.S. PATENT DOCUMENTS

| | | | | |
|---|---|---|---|---|
| 5,409,563 A | * | 4/1995 | Cathey | 156/643 |
| 5,605,600 A | * | 2/1997 | Muller et al. | 156/643.1 |
| 5,827,437 A | * | 10/1998 | Yang et al. | 216/77 |
| 6,033,997 A | | 3/2000 | Perng | |
| 6,042,687 A | * | 3/2000 | Singh et al. | 156/345 |
| 6,046,116 A | * | 4/2000 | DeOrnellas et al. | 438/715 |
| 6,066,570 A | | 5/2000 | Perng et al. | |
| 6,136,211 A | * | 10/2000 | Qian et al. | 216/37 |

* cited by examiner

*Primary Examiner*—Duy-Vu Deo

(57) ABSTRACT

A method for etching trenches in a substrate secures a wafer to an electrode in a plasma chamber and heats the wafer to a temperature of greater than 200 degrees Celsius. The wafer is exposed to a reactive plasma to etch trenches into the substrate of the wafer with minimal redeposition of etch by-products to avoid pinching off the trench and to promote further etching.

30 Claims, 5 Drawing Sheets

METHOD FOR DRY ETCHING DEEP TRENCHES IN A SUBSTRATE

BACKGROUND

1. Technical Field

This disclosure relates to semiconductor fabricating, and more particularly, to etching methods for fabricating deep trench structures in a semiconductor substrate.

2. Description of the Related Art

As semiconductor devices migrate to smaller ground rules, new fabrication processes and device structures are developed to maintain performance characteristics of these semiconductor devices. It is therefore desirable to form devices deeper in a substrate to take advantage of additional space without increasing the layout area of the devices. For example, in dynamic random access memory (DRAM) technology, a deeper trench may be employed to satisfy the per cell capacitance requirements. However, it is known that, during etching of a deep trench, a layer of redeposited etch by-products builds up inside a deep trench (DT) hole, especially at the top of the trench near a hard mask which is employed as an etch mask to pattern the deep trenches (DT).

This redeposited build-up eventually pinches off the DT hole. The accumulation of redeposited etch by-products layer occurs during DT etch, which is especially severe at the top of the DT/hard mask. As the layer of re-deposited etch by-products accumulates, the effective diameter of the DT pattern/hole is reduced as illustratively shown in FIG. 1. One effect of this is that the etching species cannot easily reach the bottom of the deep trench. Another effect is that the etching by-products cannot, easily escape from the trench. As a result, further etching of Si is impeded and the Si etch rate in the deep trenches is reduced significantly. This leads to longer etching durations to achieve incrementally higher trench depths. This is believed to be a bottleneck that impedes trench etching deeper than ~7 μm, especially for 175 nm ground rules and below. In the most severe form of the accumulation of the re-deposited etch by-products layer, the DT hole is completely closed at the top and DT Si etching stops completely.

Conventional, deep trench etching has been performed using a photoresist mask, in which case, the wafer temperature must be maintained below the glass transition temperature of the photoresist mask (i.e., less than about 140° C. Deep trench etching has also been performed using a hard mask, such as $SiO_2$. However, in all of the methods of the prior art for deep trench etching, the wafer electrode temperature is held in the conventional temperature range of $\leq 140°$ C.

Referring to FIG. 1, a schematic cross-sectional view of a re-deposited etch by-products layer 10 is illustratively shown. A hardmask 12 is patterned over a pad nitride layer 14 and a substrate 16. Deep trenches 18 are etched into substrate 16. Layer 10 accumulates on sidewalls of trenches 18 especially in a region on and near hardmask 12. An effective diameter d of trenches is reduced by re-deposited layer 10, thereby pinching off the DT structure. This buildup limits the trench depth achievable by the deep trench etching process, and impedes silicon trench etching especially for ground rules below 175 nm.

Therefore, a need exists for methods of etching deep trenches, which avoid redeposition, facilitate removal of etch by-products and permit deep trenches to be extended to greater depths in a substrate.

SUMMARY OF THE INVENTION

A method for etching trenches in a substrate, in accordance with the present invention, secures a wafer to an electrode in a plasma chamber and heats the wafer to a temperature of greater than 200 degrees Celsius. The wafer is exposed to a reactive plasma to etch trenches into the substrate of the wafer with minimal redeposition of etch by-products to avoid pinching off the trench and to promote further etching.

Another method for etching trenches in a substrate, in accordance with the present invention, includes the steps of forming a hardmask on a substrate, patterning the hardmask, securing a wafer to an electrode in a plasma chamber, maintaining the electrode at a temperature of between about 200 and about 450 degrees Celsius to achieve about the same temperature in the wafer and exposing the wafer to a reactive plasma to etch trenches into the substrate of the wafer in accordance with the hardmask pattern.

Another method for etching trenches in a substrate, in accordance with the present invention includes the steps of clamping a wafer onto a electrode in a plasma chamber, maintaining the electrode at an elevated temperature between of about 200 degrees and 450 degrees Celsius, exposing the wafer to a reactive plasma including $Cl_2$, $BCl_3$, Ar, $O_2$, and $N_2$, applying a backside pressure to the clamped wafer using He to achieve thermal contact between the wafer and the electrode such that the wafer is maintained at about the same temperature as the electrode and applying a bias power to the wafer electrode to accelerate ions from the plasma to achieve etching of the substrate to form trenches.

In other methods, the step of heating the wafer may include the step of heating the wafer to a temperature of between about 200 and about 450 degrees Celsius. The step of heating the wafer may include the step of heating the electrode such that heat is transferred to the wafer to provide the temperature of greater than 200 degrees Celsius. The step of heating the wafer may include the step of heating the electrode such that heat is transferred to the wafer to provide the temperature of greater than 200 degrees Celsius. The wafer is preferably secured by clamping and wherein the step of securing the wafer may include the step of applying a backside pressure to the clamped wafer to achieve thermal contact between the wafer and the electrode.

In still other methods, the step of exposing the wafer to the reactive plasma may include the step of exposing the wafer to a reactive plasma including at least one of $Cl_2$, HBr, HCl and $BCl_3$. The step of exposing the wafer to the reactive plasma may include the step of exposing the wafer to Ar. The step of exposing the wafer to the reactive plasma may include the step of exposing the wafer to additive gases to increase selectivity between an etch mask and the substrate during formation of the trenches. The additive gases may include at least one of $O_2$ and $N_2$. The additive gases may include $O_2$ with a flow of between about 6% to about 40% of a total gas flow. The additive gases may include $N_2$ with a flow of between about 10% to about 30% of a total gas flow. The step of exposing the wafer to the reactive plasma may include the step exposing the wafer to a gas combination including $Cl_2$, $BCl_3$, Ar, $O_2$, and $N_2$. The step of securing a wafer to an electrode may include securing the wafer in an unclamped state and the step of heating the wafer may include bombarding the wafer with plasma ions to generate heat.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides novel methods for performing deep trench etching, which minimizes etch-product redeposition and build-up within the trench structure. In one embodiment, a semiconductor wafer is placed in a plasma chamber and is clamped onto an electrode. The electrode is heated to a high temperature, preferably greater than 200° C., and more preferably between about 200° C. to about 450° C. The wafer temperature is maintained nearly stable, at this high level during the entire plasma etching process to form deep trenches. For a silicon substrate, deep trench etching is performed using a gas including a halogen mixture with appropriate additive gases. In particularly useful embodiments, the type and percent of additive gases, such as, $O_2$ and/or $N_2$ is controlled to provide a high selectivity to the silicon substrate with respect to the etch mask being used. Percentages throughout this disclosure are given in volume percent unless otherwise stated.

In accordance with the present invention, some of the advantages include: (1) precise control of profile angle and etch depth, (2) deeper trench depths, (3) higher substrate to mask selectivity compared to the prior art, and (4) higher throughput since the etch rate is increased, reducing the etching time per wafer.

Figure 1:
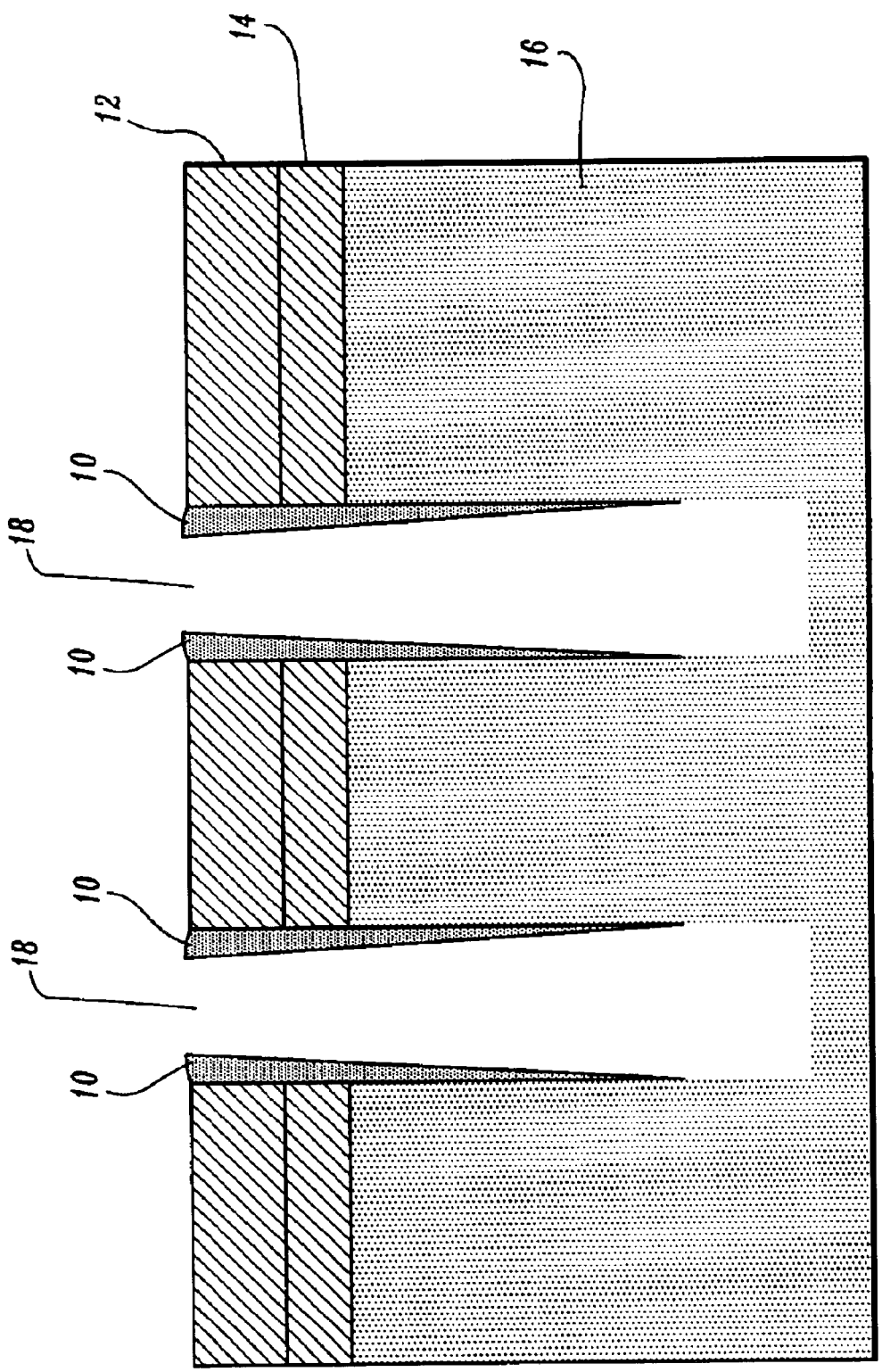
FIG. 1 is a cross-sectional view of a conventional semiconductor showing redeposition of etch by-products.
Figure 2:
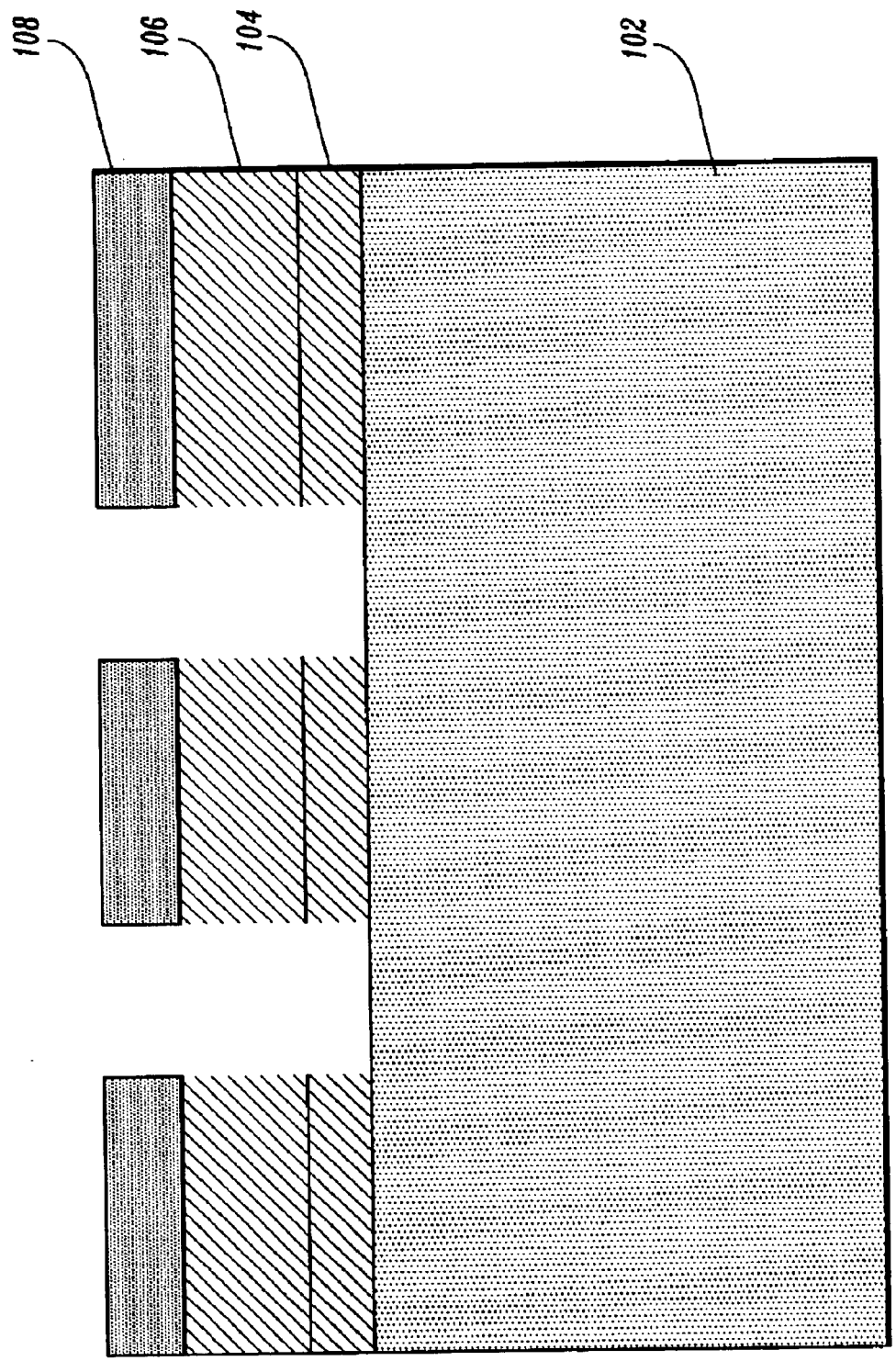
FIG. 2 is a cross-sectional view of a semiconductor structure after patterning a hardmask layer in accordance with the present invention.

Referring now in specific detail to the drawings in which like reference numerals identify similar or identical elements throughout the several views, and initially to FIG. 2, as the semiconductor technology migrates to smaller ground rules, deeper trenches are needed to satisfy the per cell capacitance requirements. For example, it is expected that a DT depth of ~8 μm or greater may be needed for sub-150 nm ground rules.

A semiconductor wafer 100 includes a substrate 102. Substrate 102 preferably includes a silicon, although other substrate materials may be employed, for example, silicon-on-insulator (SOI), gallium arsenide, etc. Substrate 102 may include a pad dielectric layer 104 employed for protecting substrate 102 during wafer processing steps. Pad dielectric layer 104 preferably includes a nitride material although other dielectric materials may be employed. Pad dielectric layer 104 also may include a pad oxide layer formed by oxidizing substrate 102.

A hardmask 106 is formed on pad dielectric layer 104. Hardmask 106 may include an oxide, such as, silicon dioxide, which may be in the form of a silicate glass (e.g., BSG, BPSG, etc.), other form of oxide, such as TEOS, silicon nitride, or combinations thereof. Hardmask 106 is used to define the DT structure being etched into substrate 102. A photoresist layer 108 is formed on hardmask 106 and patterned by a photolithography process, known to those skilled in the art. The patterned photoresist layer 108 is employed as an etch mask to pattern hardmask 106 and/or pad dielectric layer 104. Once patterned wafer 100 is placed in a plasma chamber to be plasma or dry etched in accordance with the invention.

Figure 3:
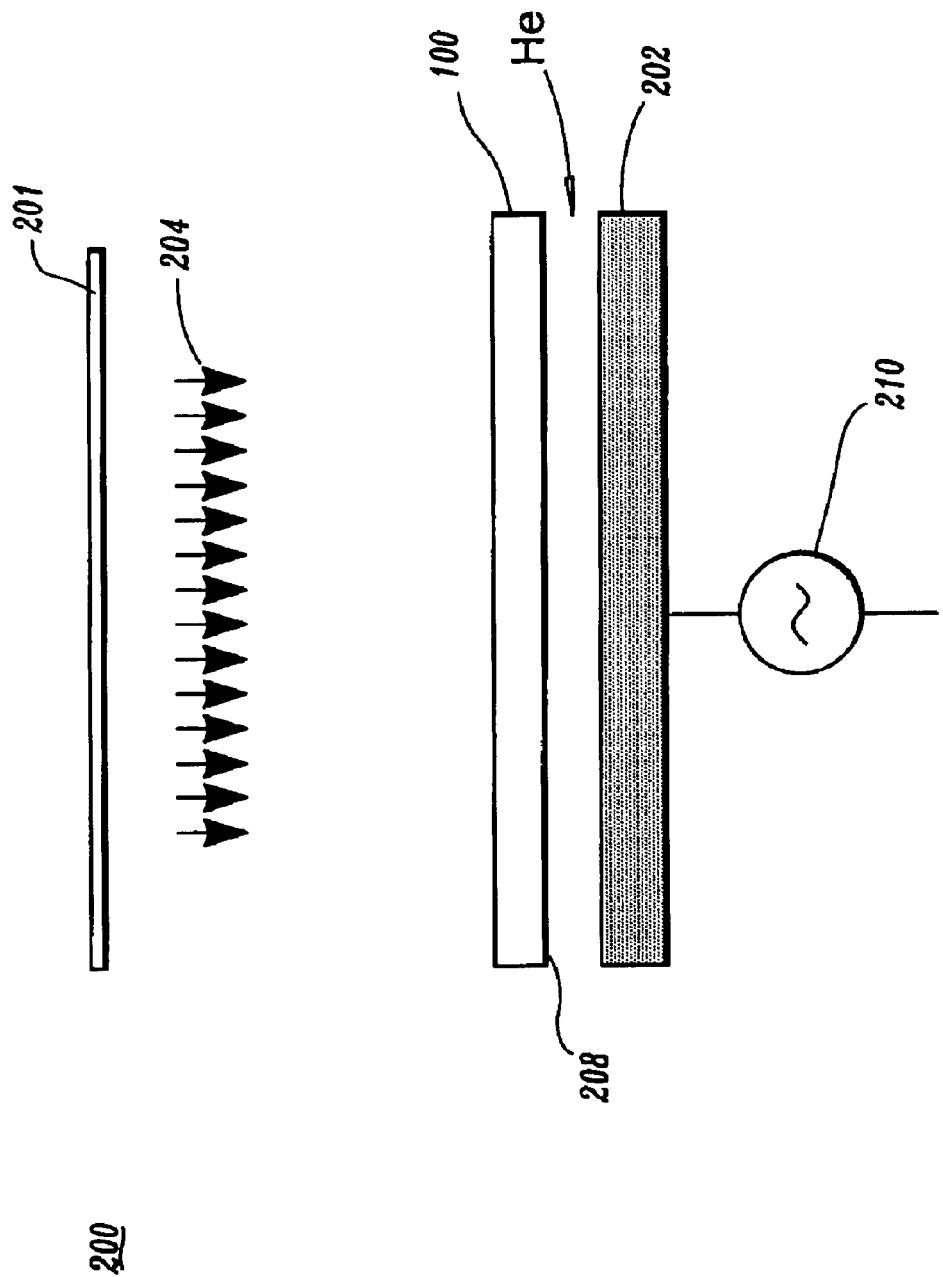
FIG. 3 is a schematic diagram of a portion of a plasma etch tool with a wafer loaded in accordance with the present invention.

Referring to FIG. 3, a schematic view of part of a plasma chamber 200 includes a wafer electrode 202. Other portions of plasma reactor/chamber include counter electrodes 201, plasma sources chamber walls (not shown), etc., which are known to those skilled in the art. Wafer electrode 202 may include wafer chucks (not shown) for securing wafer on electrode 202. Various conventional chuck designs may be employed. Wafer 100 is subjected to a reactive plasma 204 which is generated using a suitable plasma source. The plasma 204 may be generated using either radio frequency (RF) or microwave power from power source 210. The method of power coupling to the plasma may be capacitive, or preferably, inductive as is known in the art. The wafer electrode 202 is, preferably, also powered to provide additional control of ion energy at the wafer surface. Other plasma etching processes and systems may be employed to control independently plasma density and ion energy. Some examples of commercially available plasma reactors include inductively coupled plasma (ICP) reactors, transformer coupled plasma (TCP) reactors, helicon or ECR (electron cyclotron resonance) plasma source reactors, HRe⁻ reactors (available from Tegal Corporation), SPECTRA reactors (available from Tegal Corporation), etc.

A low frequency (LF) (kHz) or RF power (MHz) is provided to electrode 202. A wafer backside 208 is provided with a heat transfer medium, such as, e.g., He, to provide heat transfer to/from wafer 100 and to maintain wafer temperature control. In a preferred embodiment, the He back side pressure is maintained at a high level, for example, greater than or equal to about 7 Torr, and preferably between about 8 to about 25 Torr. Wafer electrode 202 is heated to an elevated temperature of greater than about 200° C. Since wafer 100 is clamped to wafer electrode 202 and since the thermal contact between wafer 100 and the electrode 202 is good, the wafer is also heated to an elevated temperature of greater than about 200° C. The desired wafer/chuck temperature range of operation is, preferably, between about 200° C. to about 450° C. A low-pressure plasma environment (e.g., about 20 to about 200 mTorr) is preferred.

An alternate method of achieving a high wafer temperature may include employing plasma ion bombardment induced heating. Plasma bombardments of wafer 100 heats wafer 100, while little or no backside He cooling is applied. Wafer 100 may be declamped during this type of heating process.

For the embodiment of the present invention where wafer 100 to be etched is clamped onto wafer electrode 220 which is heated to the high temperature (e.g. greater than about 200° C.), the wafer is simultaneously exposed to reactive plasma 204 which preferably includes halogen gases. Additive gases are also employed in plasma 204 to provide sidewall passivation of trenches and to provide a higher substrate (102) to hardmask (106) selectivity.

In one embodiment, wafer electrode 202 temperature is maintained at about 300° C. to about 330° C. A mixture of $Cl_2$ (e.g., about 120 sccm) and $BCl_3$ (e.g., about 10 sccm) is used to form the reactive plasma. Ar (e.g., about 30 sccm), an electropositive gas, may be added to enhance physical sputtering. The ratio of $Cl_2$:Ar should be at least 2:1, preferably greater than about 3:1. $O_2$ (e.g., about 14 sccm) and $N_2$ (e.g., about 30 sccm) may be used as additive gases primarily to provide sidewall passivation and to improve hard mask selectivity, respectively. The $O_2$ flow as a percent of total flow of ($Cl_2$+$BCl_3$+Ar) is between about 6% to about 40% and the $N_2$ flow as a percent of total flow of ($Cl_2$+$BCl_3$+Ar) is between about 10% to about 30%. A preferred amount of $O_2$ is greater than about 9% to gain the best balance between Si etch rate and mask selectivity. Other process conditions may include pressure of about 36 mTorr, a plasma source power of about 800 W, bias power of about 450 W and backside He pressure of about 7 Torr.

It is to be understood that the conditions presented herein for high temperature deep trench etching are illustrative. Other variations and combinations of these conditions may be employed in accordance with the present invention. The reactive gas mixture, for example, may include Cl (e.g., HCl, $SiCl_4$), Br (e.g., HBr) and/or F (e.g., $SF_6$, $NF_3$, $SiF_4$) or other suitable chemicals. Etching of substrate may be performed in, for example, a DPS model metal etch chamber commercially available from Applied Materials, Inc. or other plasma reactor capable of providing higher electrode temperatures.

Figure 4:
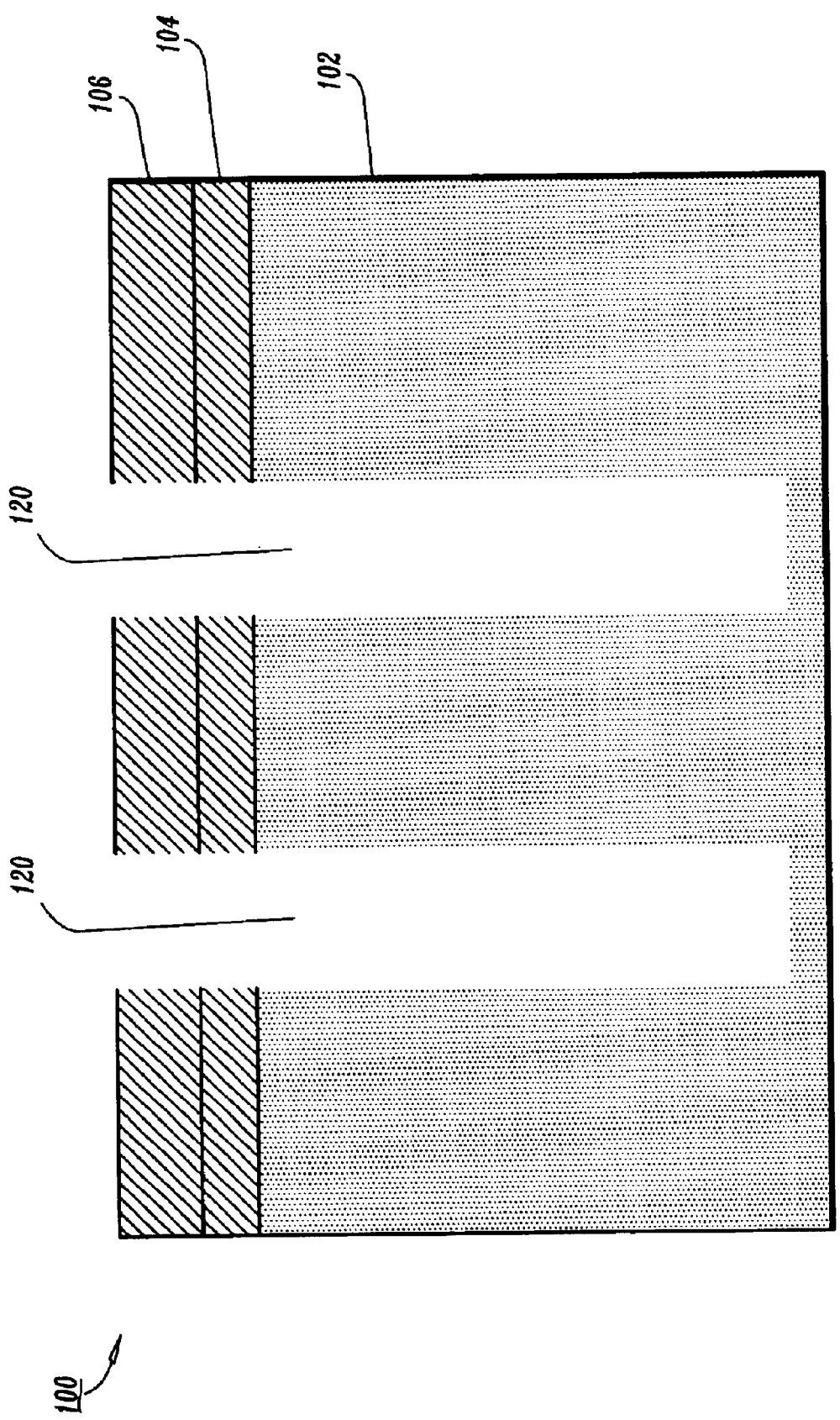
FIG. 4 is a cross-sectional view of a semiconductor structure after etching deep trenches into a substrate in accordance with the present invention.

Referring to FIG. 4, as a result of the etching process, deep trenches 120 are formed in substrate 102 in accordance with the pattern of hardmask 106. There are several advantageous effects realized by employing a high wafer temperature during deep trench etch. These effects include, for example:

1. A sticking coefficient (e.g., the probability of species incident on a surface to get adsorbed onto the surface, either by physical or chemical adsorption) of etch by-products from substrate on the trench surface and on the wafer surface decreases as the wafer temperature is increased. This results in less re-deposition actually sticking to the surface. As a result, the thickness of the layer of re-deposited etch by-products is significantly smaller at high wafer temperatures, compared to that obtained at conventional wafer temperatures (e.g., 120° C.) used in the prior art etch processes.

In fact, the high wafer temperature (320° C.) employed in one embodiment of the present invention eliminates a re-deposited etch by-products layer accumulation at the top of the deep trench 120 and, thereby, removes the impediment of deep trench pinch-off associated with the methods of prior art. The diameter of the deep feature is not reduced compared to its original dimensions.

2. The high wafer temperature causes an increase in the volatility of the etch by-products, thereby increasing the substrate etch rate. As a result, the present invention permits a deeper trench depth to be achieved for a given feature size without the deep trench hole being clogged by the re-deposited etch by-products layer. Since the wafer temperature can be precisely controlled, by controlling the wafer electrode temperature, it is possible to obtain a precise control over etch rate and over the deep trench depth. Trench depths achieved in accordance with the present invention include depths greater than about 7 microns and in preferred embodiments depths of about 10 microns or greater can be achieved!

3. Other advantages include greater control of the deep trench profile due to precise control of sidewall film deposition.

Figure 5:
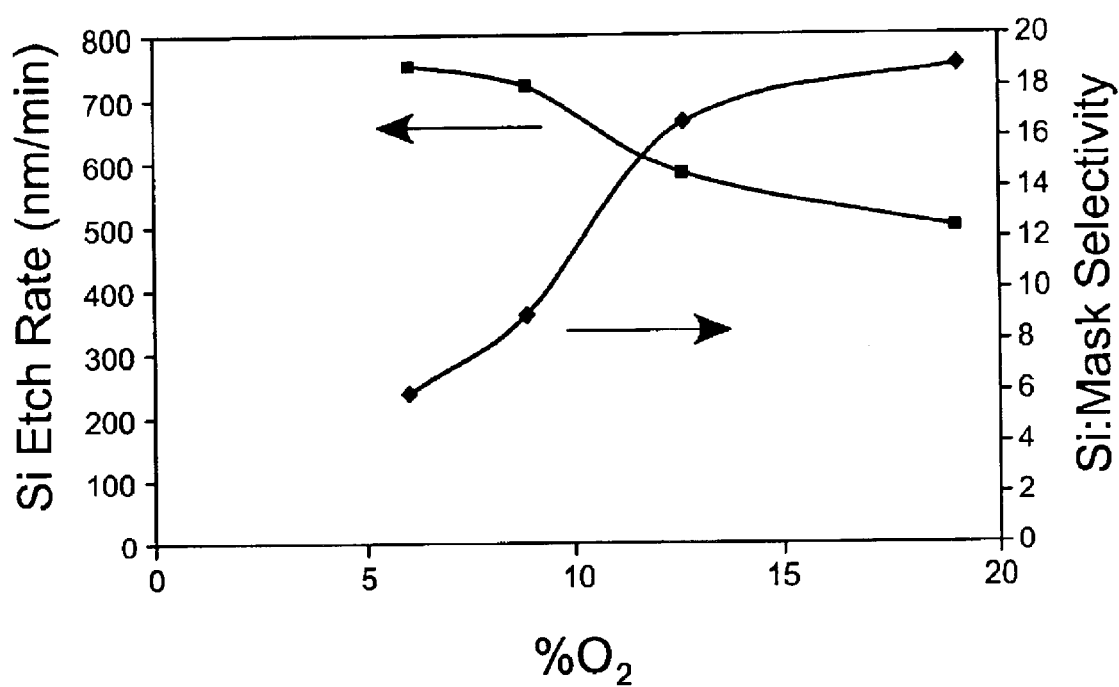
FIG. 5 is an illustrative plot showing hardmask to substrate selectivity versus oxygen content in plasma and etch rates of the substrate versus oxygen content in plasma.

Referring to FIG. 5, as the $O_2$ percentage is increased the selectivity ratio between substrate 102 and hardmask 106 increases dramatically while the etch rate of substrate 102 (e.g., Si) decreases. FIG. 5 shows experimental data on Si etch rate and selectivity as a function of the percent of $O_2$ in the plasma etch gas mixture. Surprisingly, even under conditions of a very high selectivity of, for example, about 19:1 of substrate 102 to hardmask 106, the Si etch rate is about 500 nm/min. By reducing the selectivity slightly, a large gain in the Si etch rate can be made.

Having described preferred embodiments for method for dry etching deep trenches in a substrate (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for etching deep trenches in a substrate, comprising the steps of:

securing a wafer to an electrode in a plasma chamber, the wafer comprising a silicon substrate;

heating the wafer to a temperature of greater than 200 degrees Celsius; and exposing the wafer to a reactive plasma to etch deep trenches into the silicon substrate of the wafer, wherein the deep trenches have a depth of greater than 8 µm, and wherein the deep trench etching is performed for a ground rule design of 175 nm or less.

2. The method as recited in claim 1, wherein the step of heating the wafer includes the step of heating the wafer to a temperature of between about 200 and about 450 degrees Celsius.

3. The method as recited in claim 1, wherein the step of heating the wafer includes the step of heating the electrode such that heat is transferred to the wafer to provide the temperature of greater than 200 degrees Celsius.

4. The method as recited in claim 1, wherein the wafer is secured by clamping and wherein the step of securing the wafer includes the step of applying a backside pressure to the clamped wafer to achieve thermal contact between the wafer and the electrode.

5. The method as recited in claim 1, wherein the step of exposing the wafer to the reactive plasma includes the step of exposing the wafer to a reactive plasma including at least one of $Cl_2$, HBr, HCl and $BCl_3$.

6. The method as recited in claim 5, wherein the step of exposing the wafer to the reactive plasma includes the step of exposing the wafer to Ar.

7. The method as recited in claim 1, wherein the step of exposing the wafer to the reactive plasma includes the step of exposing the wafer to additive gases to increase selectivity between an etch mask and the substrate during formation of the trenches.

8. The method as recited in claim 7, wherein the additive gases include at least one of $O_2$ and $N_2$.

9. The method as recited in claim 7, wherein the additive gases include $O_2$ with a flow of between about 6% to about 40% of a total gas flow.

10. The method as recited in claim 7, wherein the additive gases include $N_2$ with a flow of between about 10% to about 30% of a total gas flow.

11. The method as recited in claim 1, wherein the step of securing a wafer to an electrode includes securing the wafer in an unclamped state and the step of heating the wafer includes bombarding the wafer with plasma ions to generate heat.

12. The method as recited in claim 1, wherein the step of securing the wafer includes the step of applying a backside pressure of about 6 torr or greater to the secured wafer while maintaining a wafer temperature of about 200 degrees Celsius or greater.

13. The method as recited in claim 1, wherein the step of heating the wafer includes the step of heating the wafer to a temperature of between about 300 and about 450 degrees Celsius.

14. A method for etching deep trenches in a substrate, comprising the steps of:

securing a wafer to an electrode in a plasma chamber, the wafer comprising a silicon substrate;

heating the wafer to a temperature of greater than 200 degrees Celsius; and exposing the wafer to a reactive plasma to etch deep trenches into the silicon substrate of the wafer, wherein the deep trenches have a depth of greater than 8 $\mu$m, and wherein the step of exposing the wafer to the reactive plasma includes the step exposing the wafer to a gas combination including $Cl_2$, $BCl_3$, Ar, $O_2$, and $N_2$.

15. A method for etching deep trenches in a substrate, comprising the steps of, forming a hardmask on a silicon substrate of a wafer;

patterning the hardmask;

securing the wafer to an electrode in a plasma chamber;

maintaining the electrode at a temperature of between about 200 and about 450 degrees Celsius to achieve about the same temperature in the wafer; and exposing the wafer to a reactive plasma to etch deep trenches into the silicon substrate of the wafer in accordance with the hardmask pattern, wherein the deep trenches have a depth of greater than 8 $\mu$m, and wherein the deep trench etching is performed for a ground rule design of 175 nm or less.

16. The method as recited in claim 15, wherein the wafer is secured by clamping and wherein the step of securing the wafer includes the step of applying a backside pressure to the clamped wafer to achieve thermal contact between the wafer and the electrode.

17. The method as recited in claim 15, wherein the step of exposing the wafer to the reactive plasma includes the step of exposing the wafer to a reactive plasma including at least one of $Cl_2$, HBr, HCl and $BCl_3$.

18. The method as recited in claim 17, wherein the step of exposing the wafer to the reactive plasma includes the step of exposing the wafer to Ar.

19. The method as recited in claim 17, wherein the step of exposing the wafer to the reactive plasma includes the step of exposing the wafer to additive gases to increase selectivity between an etch mask and the substrate during formation of the trenches.

20. The method as recited in claim 19, wherein the additive gases include at least one of $O_2$ and $N_2$.

21. The method as recited in claim 19, wherein the additive gases include $O_2$ with a flow of between about 6% to about 40% of a total gas flow.

22. The method as recited in claim 19, wherein the additive gases include $N_2$ with a flow of between about 10% to about 30% of a total gas flow.

23. The method as recited in claim 15, wherein the step of securing the wafer includes the step of applying a backside pressure of about 6 torr or greater to the secured wafer while maintaining a wafer temperature of about 200 degrees Celsius or greater.

24. The method as recited in claim 15, wherein the step of heating the wafer includes the step of heating the wafer to a temperature of between about 300 and about 450 degrees Celsius.

25. A method for etching deep trenches in a substrate, comprising the steps of, forming a hardmask on a silicon substrate of a wafer;

patterning the hardmask;

securing the wafer to an electrode in a plasma chamber;

maintaining the electrode at a temperature of between about 200 and about 450 degrees Celsius to achieve about the same temperature in the wafer; and exposing the wafer to a reactive plasma to etch deep trenches into the silicon substrate of the wafer in accordance with the hardmask pattern, wherein the deep trenches have a depth of greater than 8 $\mu$m, and wherein the step of exposing the wafer to the reactive plasma includes the step exposing the wafer to a gas combination including $Cl_2$, $BCl_3$, Ar, $O_2$, and $N_2$.

26. A method for etching deep trenches in a substrate, comprising the steps of:

clamping a wafer onto a electrode in a plasma chamber, the wafer comprising a silicon substrate;

maintaining the electrode at an elevated temperature between of about 200 degrees and 450 degrees Celsius;

exposing the wafer to a reactive plasma including $Cl_2$, $BCl_3$, Ar, $O_2$, and $N_2$;

applying a backside pressure to the clamped wafer using He to achieve thermal contact between the wafer and the electrode such that the wafer is maintained at about the same temperature as the electrode; and applying a bias power to the wafer electrode to accelerate ions from the plasma to achieve etching of the silicon substrate to form deep trenches, wherein the deep trenches have a depth of greater than 8 $\mu$m and wherein the deep trench etching is performed for a ground rule design of 175 nm or less.

27. The method as recited in claim 26, wherein the $O_2$ includes a flow of between about 6% to about 40% of a total gas flow.

28. The method as recited in claim 26, wherein the $N_2$ includes a flow of between about 10% to about 30% of a total gas flow.

29. The method as recited in claim 26, wherein the step of securing the wafer includes the step of applying a backside pressure of about 6 torr or greater to the secured wafer while maintaining a wafer temperature of about 200 degrees Celsius or greater.

30. The method as recited in claim 26, wherein the step of heating the wafer includes the step of heating the wafer to a temperature of between about 300 and about 450 degrees Celsius.

* * * * *